United States Patent
Stoddard et al.

(10) Patent No.: US 6,574,381 B2
(45) Date of Patent: Jun. 3, 2003

(54) INTEGRATED OPTICAL SWITCH/AMPLIFIER WITH MODULATION CAPABILITIES

(76) Inventors: Robert Stoddard, 2004 Seal Way, Discovery Bay, CA (US) 94514; James Hendrix, 5952 Singing Hills, Livermore, CA (US) 94550; Jackson Koo, 2222 Dewberry Dr., San Ramon, CA (US) 94583; Conrad Yu, 1920 Gateway Dr., Oakley, CA (US) 94561

(*) Notice: Subject to any disclaimer, the term of this patent is extended or adjusted under 35 U.S.C. 154(b) by 69 days.

(21) Appl. No.: 09/938,374

(22) Filed: Aug. 23, 2001

(65) Prior Publication Data

US 2003/0039425 A1 Feb. 27, 2003

(51) Int. Cl.[7] .............................. G02F 1/035
(52) U.S. Cl. ................ 385/2; 385/16; 385/40
(58) Field of Search ................ 385/2, 16, 14, 385/24.28, 40, 37, 130

(56) References Cited

U.S. PATENT DOCUMENTS

| | | | |
|---|---|---|---|
| 5,436,759 A | | 7/1995 | Dijaili et al. |
| 5,454,058 A | * | 9/1995 | Mace et al. ............... 385/16 X |
| 5,710,847 A | * | 1/1998 | Takano et al. ................ 385/28 |
| 6,181,843 B1 | * | 1/2001 | Lee et al. ..................... 385/16 |

OTHER PUBLICATIONS

Egor Alekseev, et al., "77GHz High-Isolation Coplanar Transmit-Receive Switch Using InGaAs/InP PIN Diodes", ©1995–99 Univ. of Michigan, published at http://www.eecs.umich.edu/dp-group/PIN/gaasic98/.

S. S. Saini, et al., "A 2x2 Crosspoint Switch Fabricated On The Passive Active Resonant Coupler (PARC) Platform", IEEE Photonics Technology Letters, vol. 13, No. 3, Mar. 2001, 1041–1135/01©2001 IEEE.

C. E. Watterson, "Advanced Electro-Optic Surety Devices", Federal Manufacturing & Technologies, Allied Signal, KCP–613–6144, Jan. 1999.

* cited by examiner

Primary Examiner—Phan T. H. Palmer
(74) Attorney, Agent, or Firm—Richard B. Main

(57) ABSTRACT

An integrated optical switch/amplifier with modulation capabilities comprises a semiconductor waveguide with an input end-face and an output end-face. The waveguide is disposed on a substrate and separated from it by an I-region. A laser cavity is fabricated transverse to the semiconductor waveguide and supports a bleed laser during operation. A pair of switching electrodes with one placed on top of the semiconductor waveguide and another placed beneath the substrate provide for a selective injection of electron carriers from a top length of the semiconductor waveguide and from the substrate through the I-region. Thus, an optical signal presented at the input end-face is either blocked, modulated, or amplified-through according to the relative polarity of voltages applied to the pair of switching electrodes.

14 Claims, 4 Drawing Sheets

INTEGRATED OPTICAL SWITCH/AMPLIFIER WITH MODULATION CAPABILITIES

BACKGROUND OF THE INVENTION

1. Field of the Invention

The present invention relates to replacements for electronic switches, and more particularly to semiconductor devices for switching, amplifying, and modulating beams of light.

2. Description of Related Art

One obvious way to switch a beam of light on and off is to interrupt it with a shutter. Mirrors can be used too with the advantage of being able to redirect the beam of light elsewhere. In fiber-optic devices, moving mirrors, lenses, and other optics principles have been developed. But these mechanical methods of switching light are relatively slow, and not well-suited to high-speed switchboard and router use.

Broadband Internet communication is now being made possible by fiberoptics backbones and distribution cables that are being installed all over the world. Each fiber can carry an incredible amount of information in a single beam of laser light. Fast and effective ways are needed to be able to switch these communications channels as fast as they are able to carry data from point-to-point.

One of the present inventors, Carl E. Watterson, reported on experiments with a miniature gallium arsenide (GaAs) integrated optical switch. Such switch provided power amplification from a few milliwatts input to a one watt output according to combinations of digital signals applied to its electrodes. This GaAs optical switch integrated a curved tapered waveguide section and a segmented heatsink.

Tapered semiconductor laser amplifiers are capable of outputting powers in excess of one watt. Single-mode preamplifiers and tapered power-amplifiers have been integrated together in prior art monolithic devices for high-quality and high-power beams. The single-mode preamplifier is used to provide a proper Gaussian-shaped input to the tapered section. The one described by Watterson was a single-angle facet curved ridge preamplifier, wherein the input ridge waveguide was slanted from the crystalline cleavage plane to reduce the effective reflectivity. For a 5° angle, a three micrometer mode width, and a carrier light at 0.83 $\mu$m, the effective modal reflectivity was under $10^{-6}$.

A prior art device reported by Watterson included an integrated circuit device with a preamplifier section and a power amplifier section. The preamplifier section had three stages each with a pair of independent control electrodes. The power amplifier had another pair of independent electrodes. Each such controlled part exhibited a "contrast ratio" between the light that was passed in the "on" state and that which was passed in the "off" state. In light lock applications, as few as one stage in the off condition has to completely block light passage through the switch to maintain the locked condition.

Sol P. Dijaili, et al., describe a Cross-Talk Free, Low-Noise Optical Amplifier in U.S. Pat. No. 5,436,759, issued Jul. 25, 1995. Crosstalk is a major problem in semiconductor optical amplifiers (SOA), and Dijaili describes carrier lifetimes as being at fault. A tapered amplifier is mentioned as a prior art attempt at a solution that increases output saturation power. So a segmented transverse lasing field is proposed to reduce crosstalk. A clamping action of the laser gain reduces crosstalk by gain saturation.

SUMMARY OF THE INVENTION

An object of the present invention is to provide an optical switch.

Another object of the present invention is to provide an integrated semiconductor device that combines the functions of an optical switch and an optical amplifier.

Another object of the present invention is to provide an optical switch with modulation capabilities.

Briefly, an integrated optical switch/amplifier embodiment of the present invention comprises a semiconductor waveguide with an input end-face and an output end-face. The waveguide is disposed on a substrate and separated from it by an I-region. A laser cavity is fabricated transverse to the semiconductor waveguide and supports a bleed laser during operation. A pair of switching electrodes with one placed on top of the semiconductor waveguide and another placed beneath the substrate provide for a selective injection of electron carriers from a top length of the semiconductor waveguide and from the substrate through the I-region. Thus, an optical signal presented at the input end-face is either blocked or amplified-through according to the relative polarity of voltages applied to the pair of switching electrodes.

An advantage of the present invention is that an optical switch is provided that is rugged and suitable for use in optical signal networks and routing.

Another advantage of the present invention is that an optical switch is provided that is economical to build.

Another advantage of the present invention is that an optical switch is provided that can modulate optical signals.

The above and still further objects, features, and advantages of the present invention will become apparent upon consideration of the following detailed description of specific embodiments thereof, especially when taken in conjunction with the accompanying drawings.

DETAILED DESCRIPTION OF THE INVENTION

Figure 1:
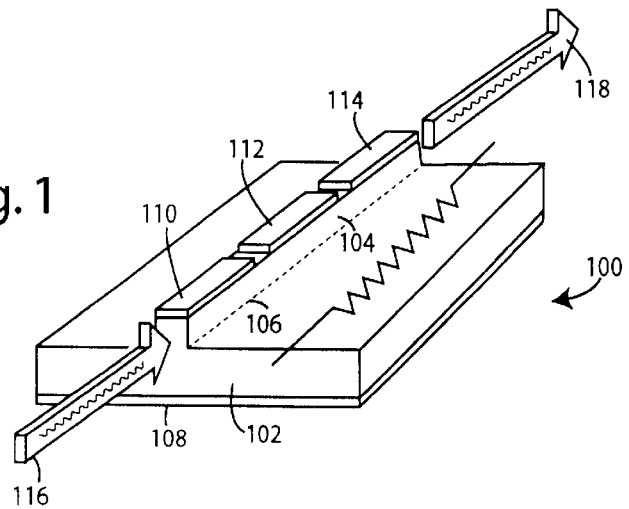
FIG. 1 is a perspective diagram of an integrated optical switch/amplifier in a first embodiment of the present invention.

FIG. 1 illustrates an integrated optical switch/amplifier embodiment of the present invention, referred to herein by the reference numeral 100. Such integrated optical switch/ amplifier 100 is fabricated as a semiconductor integrated circuit and is based on a conventional alloy of gallium-arsenide (GaAs). Ordinary GaAs material tends to operate best at light wavelengths of 800–900 nanometers. Doping with indium, e.g., (InGaAs) produces optimal operation at 1.3 micrometers. But both these wavelengths are subject to high attenuation rates in long-haul fiberoptic cables. So the prior art has settled on communication-laser carrier wavelengths of 1.55 micrometers ($\mu$m), and this can be accommodated by the use of phosphorous doping of the substrate material, as in indium-gallium-arsenic-phosphide (InGaAsP).

A substrate 102 is etched down to produce a waveguide 104. An I-region 106 separates the p-type waveguide 104 from the n-type substrate 102, e.g., a "PIN" structure. Useful information on this type of structure is described by Egor Alekseev, et al., in "77 GHz High-Isolation Coplanar Transmit-Receive Switch Using InGaAs/InP PIN Diodes", © 1995–99 Univ. of Michigan, published at http://www.eecs.umich.edu/dp-group/PIN/gaasic98/.

The material of waveguide 104 has a dielectric constant in the optical region of about ten. So waveguide 104 must be curved slightly in the plane of the substrate to squelch any Fabry-Perot parasitic laser activity, e.g., direct reflections inside between the ends. The interfaces at the ends with air will produce a mirror that is good enough to sustain lasing activity. To combat the lasing action, the waveguide is curved, preferably near the tail section, just before the light exit. The internal reflections that lasing depends on can alternatively be squelched by fabricating a straight waveguide 104 that has its end-faces off-angle with respect to one another. This arrangement is preferred where higher device-per-chip densities are needed. But such an angled end-face complicates connection in and out with fiberoptic cables. The least preferred method to control internal reflections is to place an anti-reflection coating on the end-faces.

A common (ground) electrode 108 is deposited on the backside of substrate 102 and comprises a high-quality ohmic-contact material, e.g., titanium-platinum-gold (TiPtAu). Similarly, a series of three top electrodes 110, 112, and 114, are deposited in three segments over the run of the waveguide 104. These too can be fabricated with TiPtAu. Each such series of three top electrodes 110, 112, and 114 defines a switch segment that can be independently controlled.

If any of the three top electrodes 110, 112, and 114, is more negative than the common electrode 108, electrons will be injected into the waveguide 104 and move down toward the substrate 102. Conversely, if any of the three top electrodes 110, 112, and 114, is more positive than the common electrode 108, electrons will be injected from below into the waveguide 104 and move up away from the substrate 102.

As an incoming beam of light 116 travels through the waveguide 104, it is affected by the injected electrons. If the electrons are moving down, they can give up energy in the form of photons and contribute to an amplified output light beam 118. But if the injected electrons are moving up, they will absorb energy from input light beam 116 and produce an attenuated light beam 118. When the contrast ratio is high enough, voltages applied to the three top electrodes 110, 112, and 114, can operate to produce an optical switch action through the waveguide 104. In the case of optical switch 100, all three sections must be on for light to pass through. Therefore, a simple combination lock is made possible.

In one security-lock embodiment of the present invention, a very energetic beam 116 is withheld until a digital combination voltage is applied to the three top electrodes 110, 112, and 114. If the combination is right, an output beam 118 will be produced after input beam 116 is applied. But if the combination is wrong, the energy of input beam 116 is absorbed and contributes to a deliberate catastrophic failure of switch 100. This would be useful where a permanent disablement was desirable in the event an unauthorized person attempted entry.

A laser beam is deliberately disposed transverse to the length of the waveguide 104 to deliberately reduce the "Q" of the laser cavity. This drains high energy electrons from the tops of the waveguide and stabilizes the electron density gradient top-to-bottom. The output beam 118 will suffer much less from crosstalk and other problems. The transverse laser is preferably operated at near the same wavelength as the optical carrier passing between input and output beams 116 and 118.

Figure 2:
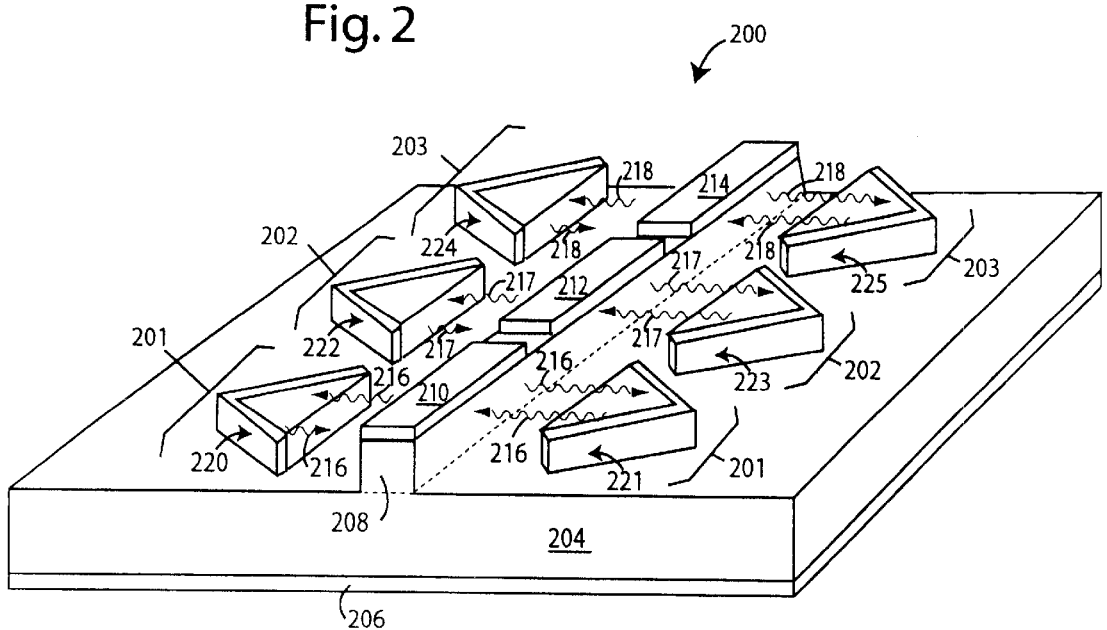
FIG. 2 is a perspective diagram of an integrated optical switch/amplifier in a second embodiment of the present invention.

FIG. 2 illustrates a multi-stage optical switch 200, and is similar to optical switch 100, FIG. 1. The multi-stage optical switch 200 comprises a first switch 201, a second switch 202, and a third switch 203. Each are independently operable. Such switches are etched on a semiconductor substrate 204 with a ground electrode 206. An optical waveguide 208 has a first top electrode 210 corresponding to first switch 201, a second top electrode 212 corresponding to second switch 202, and a third top electrode 214 corresponding to third switch 203. The electrodes 206, 210, 212, and 214 preferably comprise TiPtAu.

Each switch 201–203 is decorated with a bleed laser 216–218. A set of matching corner mirrors 220–225 are used to generate the bleed lasers 216–218 during operation. The bleed lasers 216–218 depopulate electron carriers from the waveguide 208 and provide for more stable optical amplifier operation. The mirrors are fabricated by metalizing their back surfaces.

Figure 3:
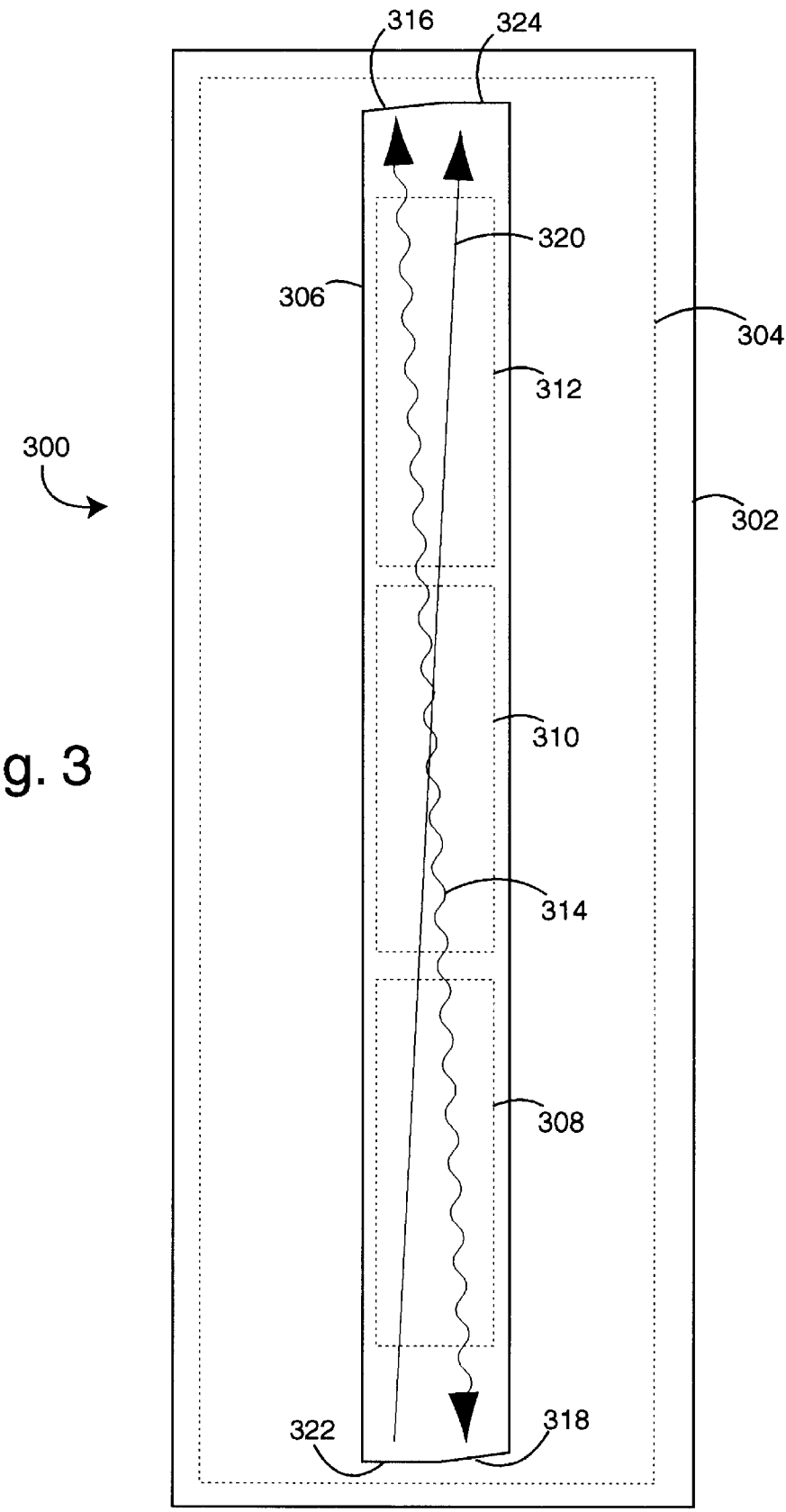
FIG. 3 is a perspective diagram of an integrated optical switch/amplifier in a third embodiment of the present invention.

FIG. 3 represents one method of manufacturing an optical switch embodiment of the present invention, and is referred to herein by the general reference numeral 300. The optical switch 300 comprises an n-type substrate 302 with a ground-plane electrode 304 on its back side. A p-type optical waveguide 306 is etched on top of the substrate 302 and separated by an I-region. For example, InGaAsP material is used. A first optical switch is defined by a first top electrode 308. A second optical switch is defined by a second top electrode 310. A third optical switch is defined by a third top electrode 312. These electrodes are used in the same manner as those described in FIGS. 1 and 2.

A bleed laser 314 is setup within the gain medium of waveguide 306 by a pair of parallel-to-each-other end mirrors 316 and 318. These define the optical cavity and are fabricated by notching the ends of the waveguide 306. A practical way to achieve parallelism between mirrors 316 and 318 is to etch them on crystal lines, e.g., 100° or 110°. Conventional semiconductor processes are well known that can etch this way. An amplified and thrice-switched optical signal 320 begins at an input end-face 322 and exits at an output end-face 324. These two end faces are not parallel so as to squelch any proclivity toward lasing of the light signal 320.

Figure 4:
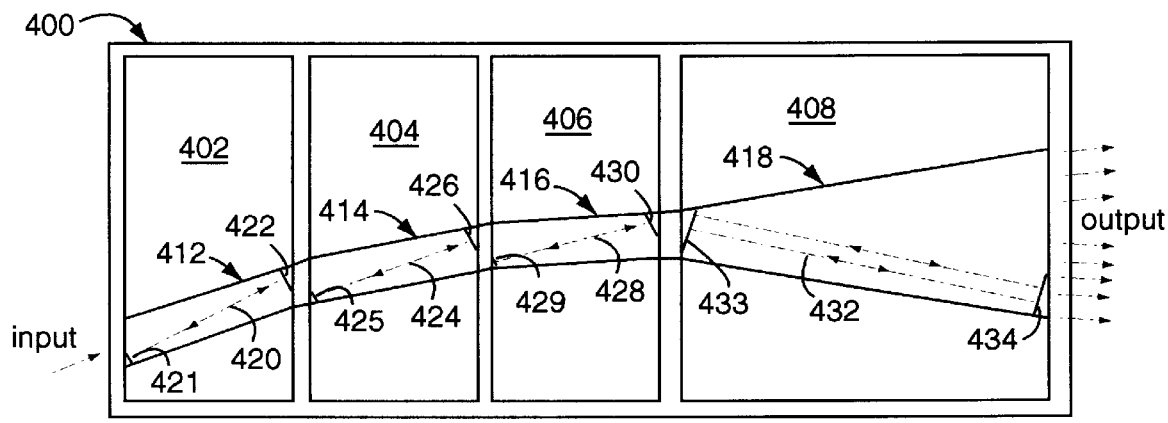
FIG. 4 is a perspective diagram of an integrated optical switch/amplifier in a fourth embodiment of the present invention in which there are four segments that form an arc with the fourth section flaring out in a tapered amplifier.

FIG. 4 represents an optical switch embodiment of the present invention, and is referred to herein by the general reference numeral 400. In this example, the optical switch 400 comprises four optical amplifier sections 402, 404, 406, and 408. As with all embodiments described herein, fewer or more sections can be used, and the appropriate number of sections to use will depend on the particular application.

A corresponding waveguide 412, 414, 416, and 418 is disposed in each of the four sections illustrated in FIG. 4. Altogether, such waveguides form a slight curve, and flare out in the tapered section waveguide 418. Bleed lasers are included within each waveguide section to control crosstalk and other signal distortions. A portion of the input face and output face 421, 422, 425, 426, 429, 430, 433, and 434, is angled away from the remaining part of the face such that the two opposite angled portions are parallel to one another and support lasing. In the first section 402, a bleed laser 420 is setup between parallel mirrors 421 and 422. In the second section 404, a bleed laser 424 is setup between parallel mirrors 425 and 426. In the third section 406, a bleed laser 428 is setup between parallel mirrors 429 and 430. And in the fourth section 408, a bleed laser 432 is setup between parallel mirrors 433 and 434. Any input optical signal is switched-off or amplified through to the output and crosses each bleed laser at an acute angle, e.g., between 0° and 90°.

The tapered, curved optical waveguide has an active medium, e.g., GaAs, InGaAs or InGaAsP, and each sectional optical amplifier is electrically excited directly. The necessary electrodes are not shown in FIG. 4 in order to show the optical portions more clearly. In general, four independent and separated electrodes are deposited over each corresponding waveguide 412, 414, 416, and 418, e.g., as in FIG. 1. The amplitude of any optical output can be modulated by adjusting the polarity and magnitude of an applied direct current voltage. The optical output can even be cutoff within any optical amplifier section by biasing the applied voltage appropriately.

Figure 5:
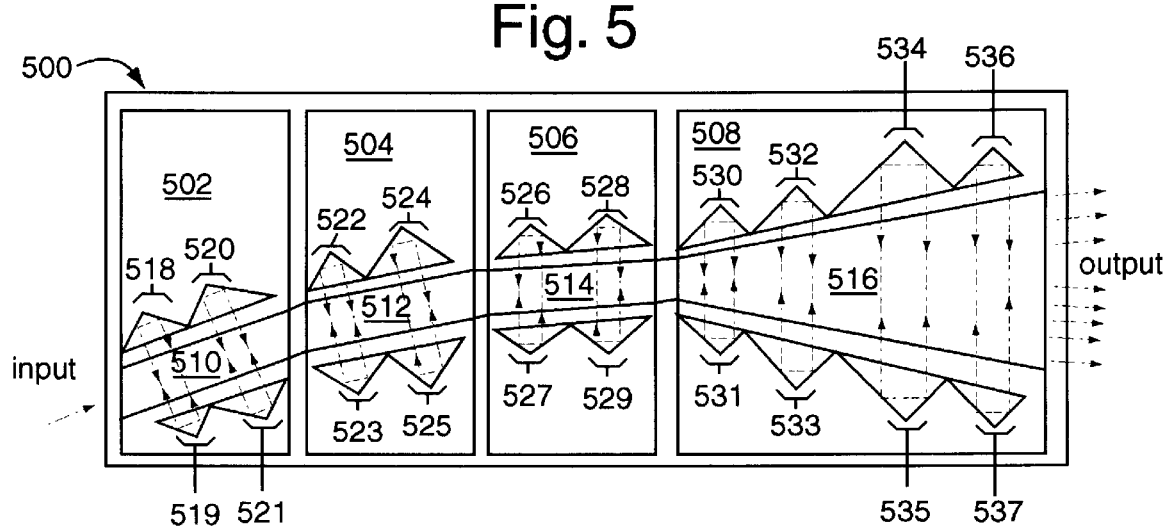
FIG. 5 is a perspective diagram of an integrated optical switch/amplifier in a fifth embodiment of the present invention like that of FIG. 4, but with bleed lasers that traverse between matching corner mirrors set on both sides of the optical amplifier channel.

FIG. 5 represents another optical switch embodiment of the present invention, and is referred to herein by the general reference numeral 500. As in FIG. 4, the optical switch 500 comprises four optical amplifier sections 502, 504, 506, and 508. A corresponding waveguide 510, 512, 514, and 516 is disposed in each of the four sections illustrated in FIG. 5. Such waveguides also form a slight curve to squelch parasitic lasing of the amplified signal. The waveguides flare out in the tapered section waveguide 516 for higher power amplification.

However, in this example the bleed lasers are arranged so the individual bleed lasers cross through the waveguides between matching retroreflector. The purpose is still the same, the bleed lasers rob enough carriers in the active media of the waveguide to reduce signal crosstalk in the amplified signal. The angles that the bleed lasers transverse the waveguides is high enough that the waveguide walls appear only as partial mirrors. But internally, the angle of the amplified signal to the waveguide walls is low enough that it sees a 100% reflector.

In the first section 502, the bleed lasers are setup between matching retroreflectors 518 and 519, and also 520 and 521. In the second section 504, the bleed lasers are setup between matching retroreflectors 522 and 523, and also 524 and 525. In the third section 506, the bleed lasers are setup between matching retroreflectors 526 and 527, and also 528 and 529. And in the fourth, tapered section 508, the bleed lasers are setup between matching retroreflector 530 and 531, between 532 and 533, between 534 and 535, and between 536 and 537. Any input optical signal is switched-off or amplified through to the output and crosses each bleed laser nominally at about 90°.

In FIG. 5 the feedback retroreflectors 518–537 are electrically pumped, therefore, are active, on the side of the tapered, curved optical waveguide. A side-retroreflector or side-pumped laser is added to each section of the tapered, curved amplifier such that the laser pumped axes are not co-linear with the optical amplifier's axes.

Figure 6A:
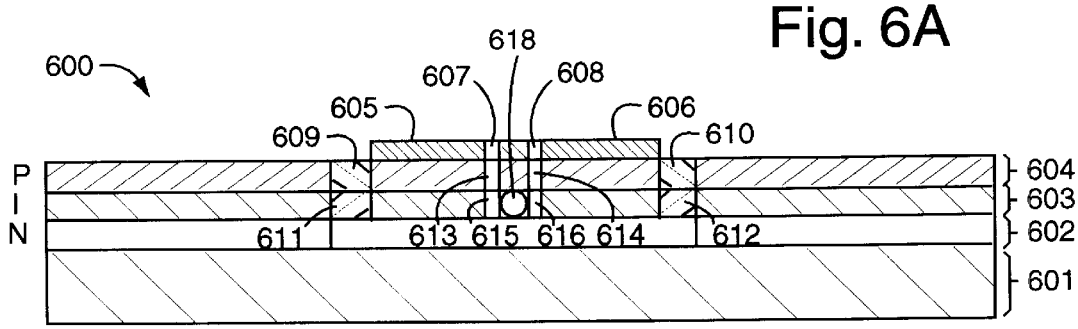
FIGS. 6A and 6B are cross-sectional and plan views of a semiconductor integrated circuit embodiment of the present invention which implements a device similar to that of FIG. 5.
Figure 6B:
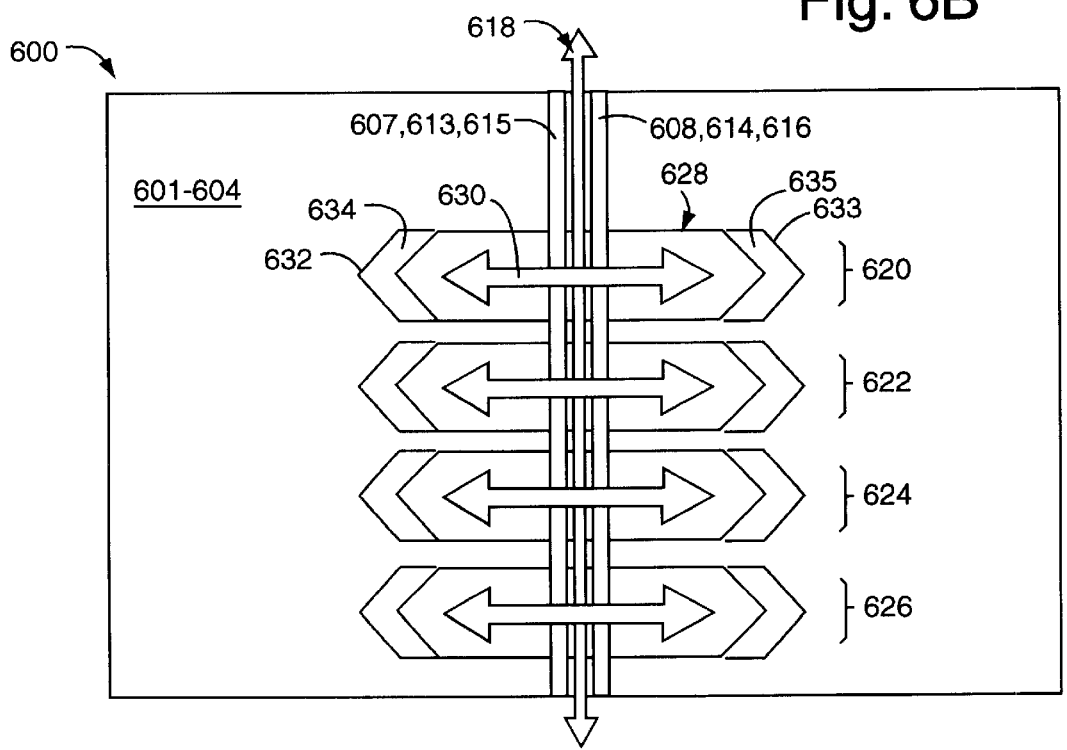

FIGS. 6A and 6B represent the results of a method of manufacturing an optical switch embodiment of the present invention using a "PIN" structure, and is referred to herein by the general reference numeral 600. Etched mirrors are preferably used to provide a guided wave region of a main signal channel, and also for noise-reducing side-pumping lasers. Curved waveguides, non-parallel transmission region interfaces, integral parallel faces for bleed lasers, tapered amplifier sections, etc., as shown in FIGS. 1–5, are usually also integrated in method 600, but are not shown in FIGS. 6A and 6B to simplify the drawings.

The several manufacturing steps form a substrate 601, an N-type layer 602, an I-type layer 603, a P-type layer 604, and metal electrodes 605 and 606. A pair of insulators 607 and 608 comprise a solid dielectric or an air gap, as needed. A pair of optical caps 609 and 610 are made of a high index of refraction material to maintain a waveguide region across a mirror gap. A pair of bleed-laser/pump-laser retroreflectors 611 and 612 are formed with either an air gap or doped semiconductor. A pair of optical covers 613 and 614 cap corresponding mirror regions 615 and 616. An optical signal flowing down a single-mode signal transmission region 618 will view the mirror regions 615 and 616 as being totally reflective. However, a transverse laser cutting across at approximate right angles will find waveguide mirror regions 615 and 616 to be only partially reflective.

Starting with a monolithic laser diode structure, e.g., GaAlAsP or InGaP, the device is etched to form both the waveguide channels and the retro-reflecting mirrors. The laser cavity mirrors can also simply be flat etched mirrors, but the Porro prism type mirrors shown will reduce susceptibility to manufacturing tolerance effects on performance.

There are two types of mirror regions, and both preferably include a three-layer stack, e.g., the N-region 602 on the bottom; a low index region 611, 615, 616, and 612; and the bleed laser 628 (FIG. 6B) active, intrinsic regions. The "low index region" has an index of refraction lower than a signal transmission region 618. The top layer 609 and 610 of the mirror stack also has a higher index, e.g. like the N-type material. Such provides for a waveguide in the mirror regions 611 and 612.

In FIG. 6B, a group of four bleed-laser regions 620, 622, 624, and 626, are associated with each of four amplifier segments, as in FIG. 5. Each bleed-laser region supports a bleed laser 630 between a pair of mirrors 632 and 633. Such can be roof reflectors or Porro prism type mirrors, as opposed to using flat mirrors, e.g., to make device fabrication easier. Each of mirror regions 634 and 635 include an outer mirror cavity surface, an etched cavity region, and an inner mirror cavity surface.

The mirror regions 611 and 612 provide a low index of refraction region to maintain the guided-wave properties for the signal transmission region 618, and at the same time act as an index-matching region to the side bleeding lasers 628. The index of the region must be low enough to provide a TIR for the signal transmission region 618, and provides a sufficient index match to the pumping laser regions to form transmissive guides between the active regions and the reflectors. The actual mirror can either be the inner or outer mirror cavity surface of the etched cavity 634 and 635.

FIGS. 1–5 have each shown three-sectioned optical switch devices, but more or fewer sections can be used to advantage in a variety of applications. The illustrations with only three sections here have merely been to help describe the construction and operation of these embodiments of the present invention.

Conventional optical routing and distribution systems use optical switches and optical amplifiers that are separate and discrete. All embodiments of the present invention combine switching and amplifying in one discrete device. Such combination improves performance and costs in Access and Metropolitan Area Networks, and other short-haul optical networks. Long-haul applications that use embodiments of the present invention may nevertheless resort to additional optical amplifiers to make up for substantial losses that occur over kilometer-long lengths of fiberoptic cable.

An electro-optical device embodiment of the present invention can therefore include an active optical waveguide that is disposed in a semiconductor integrated circuit device. The waveguide has an elongated length with a top and a bottom, and also an input and an output end. A first pair of electrodes is disposed along a first segment of the top and bottom of the active optical waveguide, such that electrically biasing the first pair of electrodes in a first polarity provides for optical amplification between the input and output ends of the active optical waveguide. And, electrically biasing the first pair of electrodes in a second, opposite polarity attenuates an optical signal directed between the input and output ends of the active optical waveguide. The electrical biasing is preferably switched between the first and second polarities to provide one of an amplified optical signal, or an almost zero optical output, at the output end of the active optical waveguide.

In digitally coded optical switches, a second pair of electrodes is disposed along a second segment of the top and bottom of the active optical waveguide. Then, electrically biasing the second pair of electrodes in the first polarity provides for optical amplification in the second segment of the active optical waveguide. And, electrically biasing the second pair of electrodes in the second, opposite polarity attenuates any optical signal directed from the input end to the output end of the active optical waveguide. Preferably, the electrical biasing is switched between the first and second polarities to provide one of an amplified optical signal, or an almost zero optical output, at the output end of the active optical waveguide. The consequence of this structure is, the electrical biasing can be switched differently between the first and second polarities between the first and second segments. This provides one of an amplified optical signal or an almost zero optical output at the output end of the active optical waveguide that depends on a parallel, binary digital code.

Although particular embodiments of the present invention have been described and illustrated, such is not intended to limit the invention. Modifications and changes will no doubt become apparent to those skilled in the art, and it is intended that the invention only be limited by the scope of the appended claims.

The invention claimed is:

1. An electro-optical device, comprising:
   an active optical waveguide disposed in a semiconductor integrated circuit device, and having an elongated length with a top and a bottom, and also an input and an output end;
   a first pair of electrodes with one each disposed along a first segment of said top and bottom of the active optical waveguide;
   wherein, electrically biasing the first pair of electrodes in a first polarity precipitates optical amplification between said input and output ends of the active optical waveguide; and
   wherein, electrically biasing the first pair of electrodes in a second, opposite polarity attenuates an optical signal directed between said input and output ends of the active optical waveguide.

2. The electro-optical device of claim 1, further comprising:
   a second pair of electrodes with one each disposed along a second segment of said top and bottom of the active optical waveguide;
   wherein, electrically biasing the second pair of electrodes in said first polarity provides for optical amplification in said second segment of the active optical waveguide; and
   wherein, electrically biasing the second pair of electrodes in said second, opposite polarity attenuates any optical signal directed from said input end to said output end of the active optical waveguide.

3. The electro-optical device of claim 2, wherein:
   said electrical biasing is switched between said first and second polarities differently between said first and second segments to provide one of an amplified optical signal or an almost zero optical output at said output end of the active optical waveguide that depends on a parallel, binary digital code.

4. The electro-optical device of claim 2, wherein:
   said electrical biasing is switched between said first and second polarities to provide one of an amplified optical signal or an almost zero optical output at said output end of the active optical waveguide.

5. The electro-optical device of claim 1, wherein:
   said electrical biasing is switched between said first and second polarities to provide one of an amplified optical signal or an almost zero optical output at said output end of the active optical waveguide.

6. An amplified light switch, comprising:
   a semiconductor waveguide with an input end-face and an output end-face;
   a substrate on which the waveguide is disposed and separated by an I-region;
   a laser cavity transverse to the semiconductor waveguide and for supporting a bleed laser during operation; and
   a pair of switching electrodes with one placed on top of the semiconductor waveguide and another placed beneath the substrate, and providing for a selective injection of electron carriers from a top length of the semiconductor waveguide and from the substrate through said I-region;
   wherein, an optical signal presented at said input end-face is blocked, modulated, or amplified-through according to the relative polarity of voltages applied to said pair of switching electrodes.

7. The amplified light switch of claim 6, wherein:
   the semiconductor waveguide is curved to control lasing of said optical signal.

8. The amplified light switch of claim 6, wherein:
   the laser cavity comprises matching corner reflectors disposed on each lateral side of the semiconductor waveguide.

9. The amplified light switch of claim 6, wherein:
   the laser cavity comprises parallel ends angularly disposed on each end of the semiconductor waveguide and adjacent to said input end-face and said output end-face.

10. An amplified light switch, comprising:

a semiconductor waveguide with an input end-face and an output end-face;

a substrate on which the waveguide is disposed and separated by an I-region;

a laser cavity transverse to the semiconductor waveguide and for supporting a bleed laser during operation;

a common ground electrode placed beneath the substrate;

a first switching electrode placed on top of the semiconductor waveguide near said input end-face, and providing for a selective injection of electron carriers from a corresponding top length of the semiconductor waveguide and from the substrate through said I-region; and a second switching electrode placed on top of the semiconductor waveguide near said output end-face, and providing for a selective injection of electron carriers from a corresponding top length of the semiconductor waveguide and from the substrate through said I-region;

wherein, an optical signal presented at said input end-face is blocked, modulated, or amplified-through according to the relative polarity of voltages applied to said first and second switching electrodes.

11. The amplified light switch of claim 10, wherein:

the semiconductor waveguide is curved to eliminate lasing of said optical signal.

12. The amplified light switch of claim 10, wherein:

the semiconductor waveguide is tapered in part to improve power amplification of said optical signal.

13. The amplified light switch of claim 10, wherein:

the laser cavity comprises matching pairs of corner reflectors disposed on each lateral side of the semiconductor waveguide for each section defined by said first and second top electrodes.

14. The amplified light switch of claim 10, wherein:

the laser cavity comprises parallel ends angularly disposed on each end of the semiconductor waveguide and adjacent to said input end-face and said output end-face.

* * * * *